United States Patent
Kin et al.

(12)

(10) Patent No.: US 6,608,305 B1
(45) Date of Patent: Aug. 19, 2003

(54) SELECTIVE DEPOSITION OF A PARTICLE BEAM BASED ON CHARGING CHARACTERISTICS OF A SAMPLE

(75) Inventors: Wong Wai Kin, Singapore (SG); Jacob C. H. Phang, Singapore (SG); John Thong, Singapore (SG)

(73) Assignee: National University of Singapore (SG)

( * ) Notice: Subject to any disclaimer, the term of this patent is extended or adjusted under 35 U.S.C. 154(b) by 0 days.

(21) Appl. No.: 09/629,409

(22) Filed: Aug. 1, 2000

(30) Foreign Application Priority Data

Feb. 29, 2000 (SG) .......................................... 200001028

(51) Int. Cl.[7] ................................................ G21K 7/00
(52) U.S. Cl. ....................... 250/306; 250/307; 250/310; 250/311
(58) Field of Search ................................. 250/306, 310, 250/311, 307, 397

(56) References Cited

U.S. PATENT DOCUMENTS

| | | | |
|---|---|---|---|
| 3,919,553 A | 11/1975 | Cohen et al. ................ | 250/311 |
| 4,791,294 A | 12/1988 | Furuya ........................ | 250/310 |
| 5,302,828 A | 4/1994 | Monahan ..................... | 250/307 |
| 5,977,542 A * | 11/1999 | Singh et al. ................. | 250/307 |
| 6,066,849 A * | 5/2000 | Masnaghetti et al. ........ | 250/310 |
| 6,172,363 B1 * | 1/2001 | Shinada et al. ............. | 250/310 |

FOREIGN PATENT DOCUMENTS

WO    WO 01/59807 A1    8/2001

* cited by examiner

Primary Examiner—John R. Lee
Assistant Examiner—Kalimah Fernandez
(74) Attorney, Agent, or Firm—David Jaffer; Pillsbury Winthrop LLP

(57) ABSTRACT

A method of preparation of a map of areas on a sample that collects charge, and a method for using the map to selectively scan and modulate the intensity of the electron beam of a SEM so as to discriminate between the charging and non-charging areas of the sample. To generate the charging map, an image is first checked for saturation. The frame for the image is acquired by using digital scan control coupled with digital acquisition of the secondary electron detector signal. The next step is to perform a "fast scan" where the first frame is taken at the maximum frame rate that the system is capable of. A fast scan does not allow time for significant charge to collect on surfaces, and this provides a base level to subtract from a slower scan that allows charge to accumulate. Areas where the difference between the two is larger indicate areas of charge collection. A "slow scan" is then performed. The frames are then subtracted pixel-by-pixel in order to isolate the charging component of the image. After the pixel-by-pixel subtraction, the charging map is created.

To obtain a more ideal charging map, further image processing is performed to reduce the noise level as well as to merge pixels together to form a fuller representation of a charging feature. The selective deposition process for charging reduction is accomplished by modulating the electron beam intensity to adjust the dosage on a sample based on the charging map. The total charge build-up on the charging areas is controlled by depositing the beam on the charging areas only on selected scans. The non-charging areas are preferably exposed to the beam during every scan, which, together with averaging performed using a plurality of scans, maximizes the S/N (signal-to-noise) ratio.

6 Claims, 3 Drawing Sheets

SELECTIVE DEPOSITION OF A PARTICLE BEAM BASED ON CHARGING CHARACTERISTICS OF A SAMPLE

FIELD OF THE INVENTION

The present invention relates generally to the field of charged particle beam technology and particularly to a method of selectively depositing a charged particle beam on a sample based on the charging characteristics of a sample in a charged particle beam imaging device such as a scanning electron microscope.

BACKGROUND OF THE INVENTION

Particle beam imaging devices, such as a scanning electron microscope (SEM) are well known. Unlike optical microscopes, a SEM uses an electron beam rather than a light beam to obtain an image of a sample. The short wavelength of the electron beam allows SEMs to achieve resolutions that are not possible with traditional optical microscopes. Hence, SEMs are often used to inspect objects having very small dimensions, such as semiconductor devices with intricate patterns.

While a SEM can achieve greater resolution than an optical microscope, a SEM suffers from problems associated with charging artifacts, a phenomena not associated with optical microscopes. SEMs rely on the observation of electron signals from an object being analyzed to obtain information about the topography and composition of the object. Charging artifacts greatly impede this process. A SEM relies on the detection of secondary electron emissions from an object onto which an electron beam is directed, the level of secondary emission giving an indication of the surface topography of the object. An example of what is known as a charging artifact is when a portion of an object collects and stores electrons, i.e.; collects charge. The stored charged (charging artifact) affects the level of secondary electrons, which then is no longer a good indication of the object topography. Charging artifacts have been discussed extensively in many scientific journals and papers, as well as in patent documents such as U.S. Pat. Nos. 3,919,553 and 5,302,828. Therefore, they are a well known phenomenon to those skilled in the art.

There are many types of charging artifacts that can be linked to a multitude of imaging problems. Although some of these phenomena have been extensively studied, no integrated platform for the comprehensive solution of the charging problem has been proposed or implemented. One particular charging artifact that is relevant to the present invention is one which may be called partial charging. This phenomenon occurs when a specimen being viewed contains features that are electrically conductive, e.g. metals, as well as features that are non-conductive, e.g. pure silicon. The conductive features dissipate charge easily while the non-conductive features tend to collect the charge. Hence, the charge artifacts are found only on the non-conducting features. For specimens having this type of topography, it would be useful to determine the areas that are prone to charging versus those areas which are not. Having such a map would allow a system to selectively deposit the electron beam on a particular feature based on the charging characteristic. The prior art does not provide an effective way to accurately map the charging characteristics of a specimen, and as a result, selective deposition is currently not employed.

OBJECT OF THE INVENTION

It is therefore an object of the present invention to characterize or monitor the charging state of a sample so that the charging areas can be identified and mapped.

It is another object of the present invention to scan the electron beam in such a way that charging artifacts are equalized or eliminated in a sample.

SUMMARY OF THE INVENTION

The present invention provides a method of preparation of a map of areas on a sample that collects charge, and a method for using the map to selectively scan and modulate the intensity of the electron beam of a SEM so as to discriminate between the charging and non-charging areas of the sample. The present invention is able to reduce contrast artifacts in charging samples and facilitate the restoration of the dynamic range of the image so that sample features can be more easily interpreted.

It is generally known that conventional raster scanning of insulators under certain conditions introduces charging artifacts due to the relatively high intensity of the electron dose. Raster scanning also does not take into account the charge state of the points being irradiated. The present invention provides a method of scanning the electron beam or other type of particle beam so as to take into account the charge condition of the sample and equalize the charging effects.

To generate the charging map, an image is first checked for saturation. The frame for the image is acquired by using digital scan control coupled with digital acquisition of the secondary electron detector signal. The next step is to perform a "fast scan" where the first frame is taken at the maximum frame rate that the system is capable of, which is about 1.5 seconds per frame in the current implementation. A fast scan does not allow time for significant charge to collect on surfaces, and this provides a base level to subtract from a slower scan that allows charge to accumulate. Areas where the difference between the two is larger indicate areas of charge collection. A "slow scan" is then performed where the frame is acquired in about 23 seconds. The frames are then subtracted pixel-by-pixel in order to isolate the charging component of the image. A lower bound on the pixel intensity is used as the threshold in the subtraction to reduce noise effects. After the pixel-by-pixel subtraction, the charging map is created.

The charging map derived using only the steps described above is not in an optimal form for beam pulsing because the charging pixels are too sporadic and discontinuous, resulting in an excessive noise level. To obtain a more ideal charging map, further image processing is performed to reduce the noise level as well as to merge pixels together to form a fuller representation of a charging feature. This form of the charging map is then optimal for use in the selective deposition method for charging reduction according to the present invention.

The selective deposition process for charging reduction is accomplished by modulating the electron beam intensity to adjust the dosage on a sample based on the charging map. The process begins by generating the charging map as described above. The total charge build-up on the charging areas is controlled by depositing the beam on the charging areas only on selected scans. In the next step, the duty cycle for the charging area is set by determining an interleave factor x defined as the alternate number of scans during which the charging area is exposed to the electron beam during a series of scans of the sample. The non-charging areas are preferably exposed to the beam during every scan, which, together with averaging performed using a plurality of scans, maximizes the S/N (signal-to-noise) ratio. The entire process is repeated until the selected number of frames have been exposed. The repeated steps are the charging map generation and charging reduction.

The mapping and selective deposition processes are preferably controlled by software running on a PC coupled to the SEM. Also implemented is a frame by frame capture function to store the results. The frame capture and averaging are done using image buffers stored in the PC memory to eliminate the need for unnecessary scans of the sample.

DETAILED DESCRIPTION OF THE INVENTION

Figure 1:
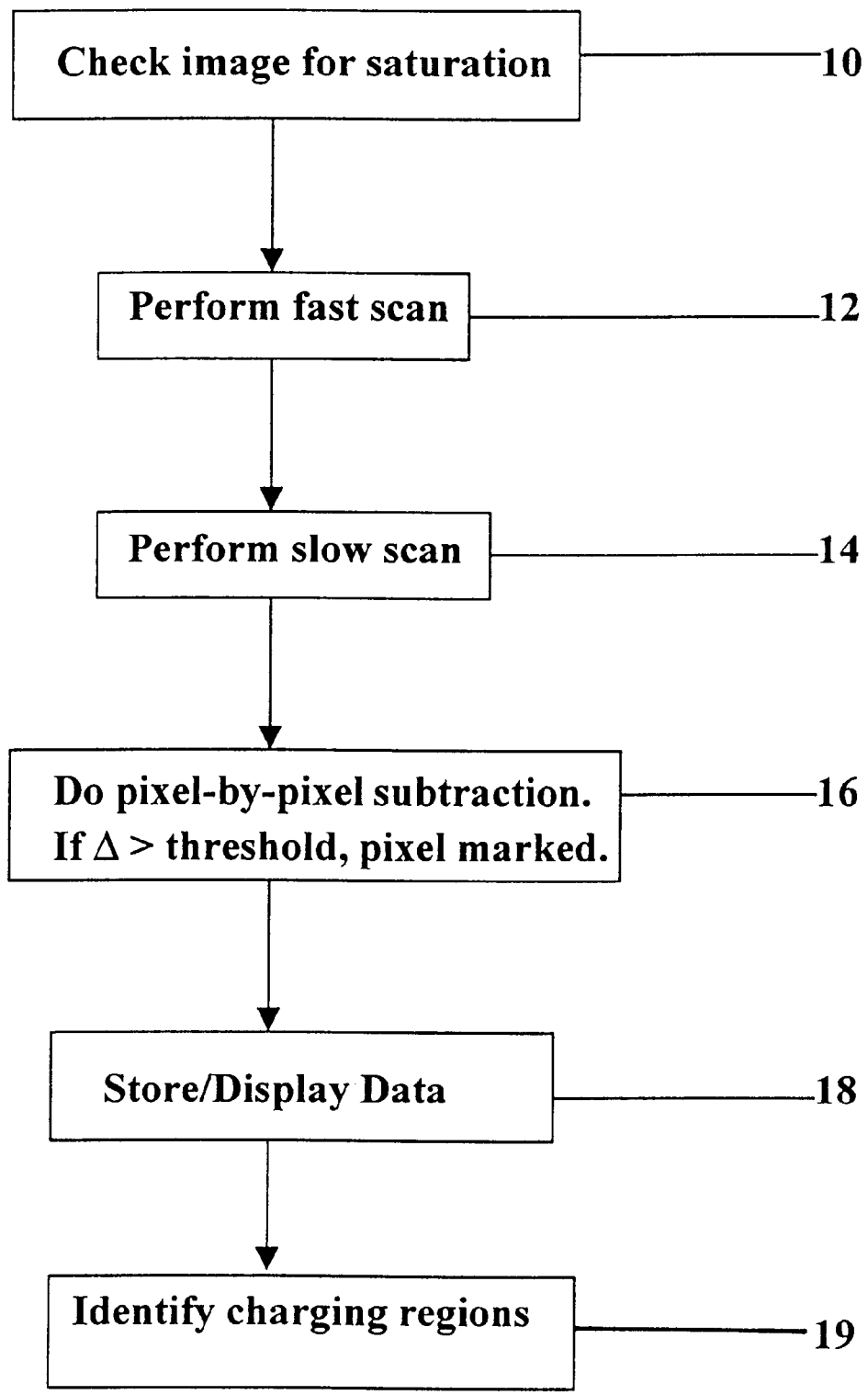
FIG. 1 is a flow diagram showing the steps for the process of generating a charging map using the scan rate discrimination technique.

The method of the present invention is a beam modulation-based technique for a SEM system that creates a charging map by selectively scanning a sample, discriminating between charging and non-charging areas in charging samples to reduce contrast artifacts and facilitate the restoration of dynamic range of the image so that sample features can be more easily interpreted. A charging map is defined herein as data in any form that indicates the charging and/or non-charging characteristic of areas on a sample. Areas that have insulative properties tend to accumulate charge, while areas that are conductive dissipate charge.

It is generally known that conventional raster scanning of samples with insulative properties under certain conditions introduces charging artifacts due to the relatively high intensity of the electron dose. Simply raster scanning a sample does not provide any compensation for the charge state of points being irradiated. The present invention provides a method wherein a map of a sample is prepared, indicating areas having insulative properties, i.e. areas that will accumulate charge. This map is then used to selectively deposit electrons by modulating the intensity of the electron beam so as to compensate for insulative/charging areas of the sample for the purpose of allowing the SEM to more accurately display the topography of the sample.

Although the preferred embodiment of the present invention is applied using a conventional scanning electron microscope with a PC connection, the method also applies to other particle beam imaging devices such as imaging devices using an ion beam.

The method of creating a "charging map" according to the present invention will now be described. This method is able to generate charging maps indicating the areas of the sample that exhibit secondary electron contrast artifacts. As noted above, these areas are generally those having an electrically insulative property.

Consider a SEM detector with pixel locations (x, y) representing corresponding locations on a sample. The signal level from the pixel at a time t can be expressed as $$F(x,y,t)=I(x,y,t)+C(x,y,t) \qquad (1)$$

Where

F(x, y, t)=final resultant signal at detector output

I(x, y, t)=signal due to inherent contrast mechanism of the sample

C(x, y, t)=signal due to local charging at the scan point of the sample

For a constant operating condition, i.e. constant beam voltage, beam current and specimen geometry relative to the electron beam, I(x, y, t) does not change with time t.

$$F(x,y,t)=I(x,y,0)+C(x,y,t) \qquad (2)$$

where t=0 in I(x, y, t) denotes time-invariance. By recording the changes in F(x, y, t) as t changes, we can therefore isolate the charging component C(x, y, t).

Isolating C(x, y, t) using image-based subtraction techniques requires at least two scans of a sample, yielding dissimilar images. The difference between the images is due to a longer scan time for one scan relative to the other, causing a difference in charge storage between the two scans. Another condition is that the differences between the images must be due to charging artifacts alone, i.e. only the C(x, y, t) component is changing. In practice, the change in C(x, y, t) can be obtained simply by subtracting consecutive frames/scans. However, the presence of noise in the images introduces noise in the resultant difference image. Hence, a lower bound on the magnitude of the pixel difference, i.e. a predetermined threshold, has to be included to minimize the effects of noise.

In order to generate adequately different images, according to the preferred embodiment of the present invention the sample is scanned at a first rate to generate a first image, and then at a second rate to generate a second image. With a constant electron beam strength, the two images are significantly different if the first and second scan rates are adequately different. The slower scan rate delivers a higher electron dosage to the sample, causing larger collection of charge in the charging areas of the sample. Alternate embodiments of the invention include different electron beam strengths for the two scans, or a combination of different beam strengths and different scan rates.

The steps for generating the charging map are shown in the block diagram of FIG. 1. In step 10, the image is checked for saturation. In step 12, a "fast scan" of the sample is performed where the first frame is taken at the maximum scan rate that the system is capable of, which is about 1.5 seconds per frame in the current implementation. In step 14, a "slow scan" is performed where the frame is acquired in about 23 seconds. Note that the absolute frame times are not important and will vary depending on the particular implementation of a system, but rather it is the relative frame time which is critical, i.e. one frame time being much longer than the other frame. The frames are acquired using digital technology to detect the secondary electron signals and display the result on a digital display. Having acquired and stored two significantly different images, the two frames are then subtracted pixel-by-pixel, providing data indicating the charging characteristic of the sample (step 16). A lower bound on the pixel intensity is used in the comparison to reduce noise effects. If the difference between the two scans exceeds the lower bound, determined using histogram analysis of the images, the data is accepted, i.e., pixel data is recorded/marked. After the pixel-by-pixel comparison, the resultant data is stored or displayed for use (step 18). In step 19, the charging regions are identified for use in the selective deposition. In the preferred embodiment, the comparison involves subtracting the values of corresponding pixel intensities of two scans, where the two scans are performed at different scan rates. The present invention also includes other comparisons than simple subtraction, and other ways of performing two different scans. For example, two scans can be distinguished by having different beam intensities as well as or rather than a different scan rate.

The selective deposition process for charging reduction basically varies the dosage on a sample based on the charging map of the sample. For the non-charging areas, i.e. the dark areas on the charging map, irradiation by the electron beam occurs at every frame. Averaging is also performed at every frame to minimize the noise and maximize the S/N ratio for the non-charging areas. For the charging areas, i.e. the bright patches on the charging map, irradiation only occurs every selected number of frames. As this technique selectively scans the sample to reduce electron dose in charging areas, it is named the selective deposition charging-control technique.

Figure 2:
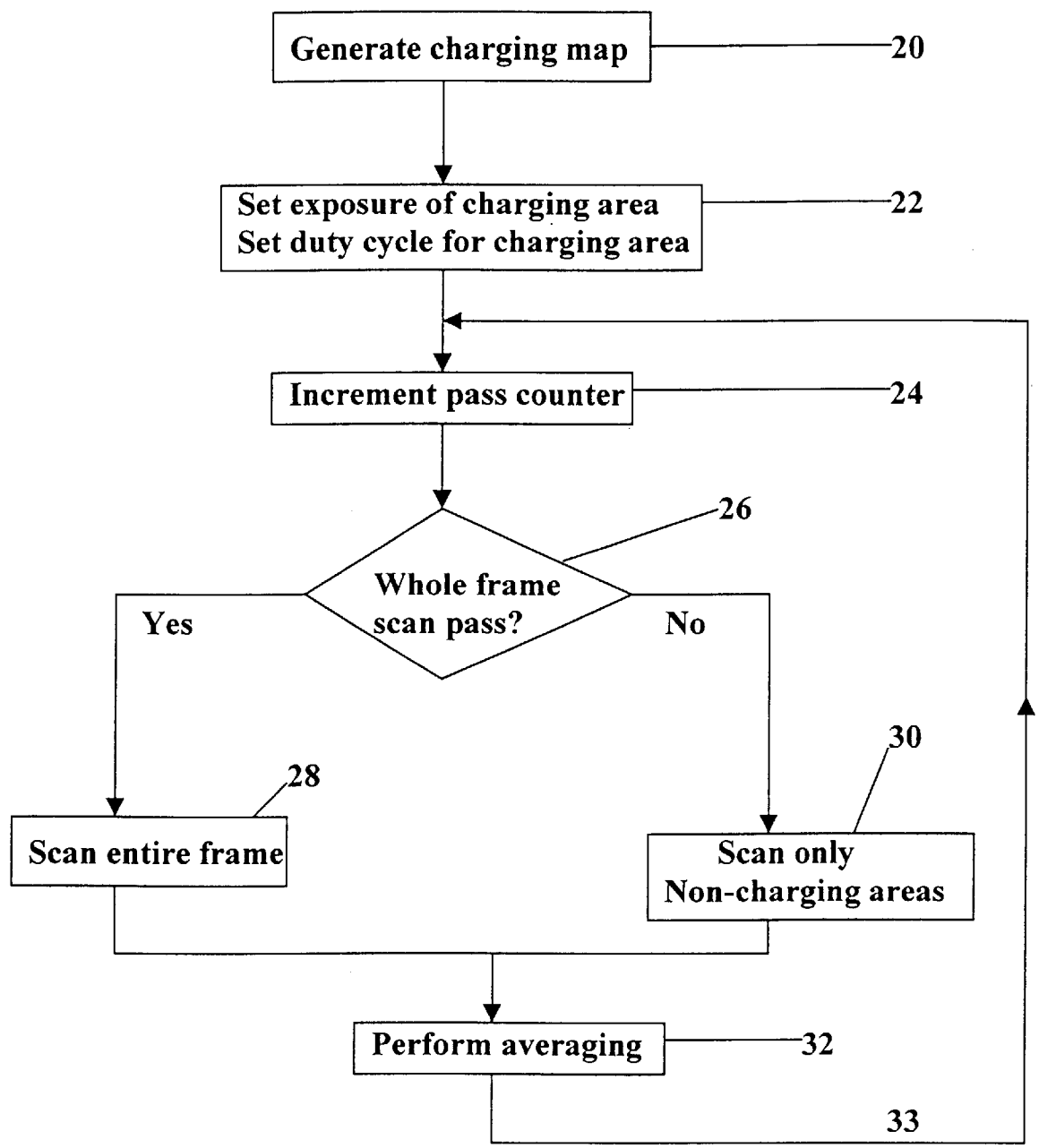
FIG. 2 is a flow diagram illustrating the steps for the selective deposition process.

The flowchart of FIG. 2 shows the steps in the Selective Deposition process for charging reduction. In step 20, the charging map is generated, as described in reference to FIG. 1. According to the present invention, the areas indicated as "charging" areas in the charging map are exposed to a reduced level of exposure to the electron beam during a series of scans, i.e. frames. The present invention includes various ways this can be done which will be apparent to those skilled in the art. Step 22 of FIG. 2 represents the operation of setting the degree of exposure. According to the preferred embodiment, the charging areas are exposed to the beam only during a selected percentage of the scans, i.e., a duty cycle is set for the charging areas. The duty cycle for a charging area is set by determining an interleave factor x. This factor x controls the number of frames that expose the charging areas to the particle beam. The factor x is determined by the charge decay time of the sample under a given scanning condition, i.e. the beam current, beam voltage, pixel dwell time and sample-election beam geometry. Because different areas may have different charging characteristics, a different factor x is maintained for the two regions to provide an optimum electron dose for each area.

In step 24, a pass counter is incremented to keep track of the number of passes or frames. In step 26, it is determined whether a whole frame should be scanned, or only the non-charging areas. This is set by the interleave factor x. For example, a factor x of 10 could indicate that the entire frame is to be scanned (which includes both the charging and non-charging areas), step 28, in only one frame out of ten frames; for the other nine frames, only the non-charging areas are scanned, as indicated by step 30. Finally, the results of a number of adjoining pixels are averaged to maximize the S/N ratio according to step 32. The process is repeated, as indicated by line 33, until the selected number of frames have been exposed.

The sequence is preferably controlled by software running on a PC coupled to the SEM. Also implemented is a frame by frame capture function to store the results. The frame capture and averaging are done using image buffers stored in the PC memory to eliminate the need for unnecessary scans of the sample.

The above process is based on the following principle. The presence of charge-dissipation paths in a real and finitely-insulating sample allow the sample to return to the initial uncharged state after being given an electron dose. This is shown in samples that self-discharge after the primary electron beam is turned off. This means that a charge dissipation rate constant, $f_d$, can be defined for any point irradiated by an electron beam. If the rate of charge injection $f_{inj}$ at a particular pixel exceeds $f_d$, then a net gain in charge occurs, and the pixel charges up negatively in the case of irradiation by an electron beam. Conversely, charging can be avoided if the time between successive doses is increased to allow for the excess charge to be dissipated, i.e. $f_d > f_{inj}$. Note that $f_d$ is dependent on parameters such as beam energy, specimen geometry, sample composition and surface condition.

Evaluation of the charge dissipation rate constant $f_d$ requires a charge monitor. Monitoring/determining $f_d$ can be done with the use of a histogram of the image. According to this method, successive frames are captured at the highest possible scan rate to minimize charging. A histogram of each frame is prepared, and the histograms of these frames are continuously compared. A waiting period, i.e. a time between scans when the sample is not being irradiated, termed an inter-frame delay time, is then gradually increased until the histograms obtained reach equilibrium. At this point, a steady-state scanning rate is achieved where the charge injection by the electron beam is fully compensated by adequate charge dissipation time, resulting in zero net charge build-up. This procedure is performed only on the charging portions of the sample selected from the charging map of the sample. The remaining non-charging portions are given maximum exposure to the electron beam to obtain the best S/N ratio for these areas.

In summary, the charging maps of moderately charging insulators are prepared according to the method described in reference to FIG. 1 involving calculations based on measurements done on scans performed at different rates. A process of selective deposition is then used to reduce charging in the charging areas/insulating areas of a sample, these areas indicated by the charging map. The method of selective deposition uses the intrinsic decay mechanism present in moderate insulators. By varying the exposure of the charging areas to the electron beam, the charging effects can be reduced in the insulating areas without sacrificing resolution and S/N performance in the non-charging areas. This technique provides a more optimized imaging of partially-charging samples compared with conventional beam blanking techniques which do not differentiate between charging and non-charging areas.

The method of the present invention involves generating a charging map for a sample, and then using this map to selectively irradiate the sample to compensate for the charging areas. The method described above for generating the charging map and for selective deposition is set forth as the preferred embodiment. Upon reading this disclosure, other methods of preparing a charging map and of selective deposition will be apparent to those skilled in the art, and these are to be included in the spirit of the present invention.

An alternative method of preparing a charging map will now be described that uses a "charge balance" concept and provides a more direct indicator of the charge condition on the sample. The charge balance in a specimen being scanned by an electron beam is derived from the principle of universal conservation of charge. It can be used to generate a 2-dimensional map of the sample showing sections where the charge balance condition is violated and hence charging could be present. This method utilizes the specimen current and the emission images which are obtained from the electrical current through the sample and the emitted charged particles from the sample respectively.

After normalizing the dynamic range of the specimen current and the emission images, the next step in applying the Charge Balance condition is to add the specimen current image and the emission image together. If the Charge Balance condition holds, a perfect monotone image is obtained. A monotone image is one having only a single gray level, i.e. without any gray level variations. It can be evaluated using a histogram profile of the image, which would show only one gray level. Any deviation from the monotone indicates that charging is present. Darkened portions of the summed image indicate that the sample is charging negatively in the case of an electron beam system. Conversely, brighter spots indicate positive charging.

Figure 3:
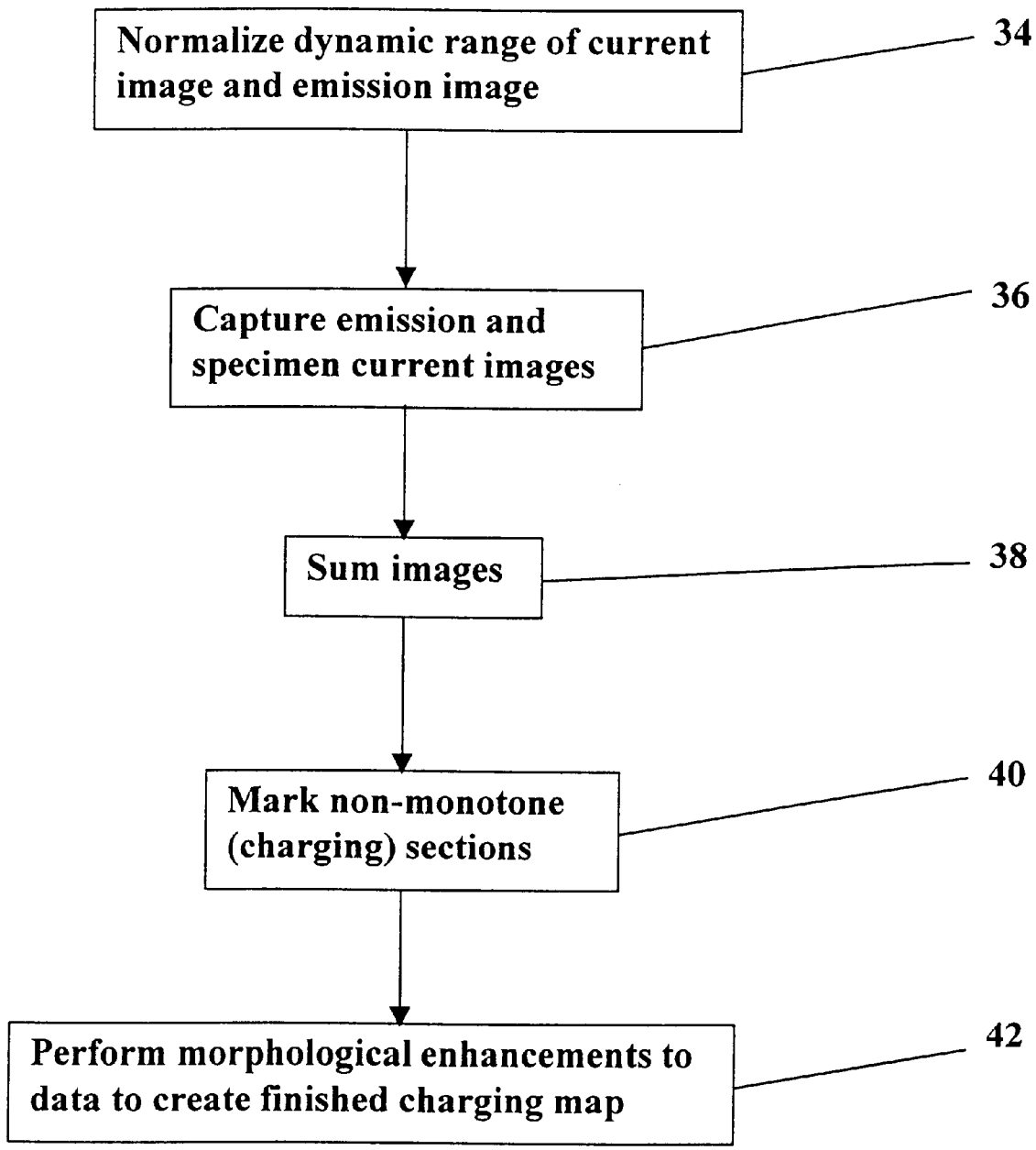
FIG. 3 is a flow diagram illustrating the steps for the charge balance charging map generating process.

The flow diagram in FIG. 3 illustrates the steps for generating a charging map based on the charge balance principle described above. Referring to FIG. 3, in step 34, the dynamic range of the specimen current image and the emission image is normalized. In step 36, the images corresponding to the emission and specimen current are prepared. The specimen current and the emission images are obtained from the electrical current through the sample and the emitted charged particles from the sample respectively. In step 38, the emission image and specimen current image are added together by doing a pixel-by-pixel addition of each pixel of the emission image with a corresponding pixel of the current image. In step 40 the areas of the summed image which are not monotone are marked or noted to indicate the charging areas. In step 42, the finished charging map is created submitting the data of block 38 to morphological enhancements such as those described for the preferred map generation method mentioned above. The term "morphological enhancement" is a general term in image processing used to refer to the family of image-processing functions used to improve the continuity of image features.

Although generally an SEM system can be used to generate the charge balance map described herein, a few components need to be added to detect the different currents, if the SEM system does not already come with these facilities. Mainly, the SEM system should have a detector for detecting and amplifying the secondary emission current, the backscattered emission current, and the specimen current which is connected to a common PC or some other computing apparatus.

This technique has been shown to provide useful insights into the fundamental charge state of the sample. It is able to discriminate between real and false features. As it measures the rate of charge flow, it is particularly applicable in cases where the additional charging current is non-zero. Finally, it is also dependent on precise alignment between the emission and the specimen current image. This condition means that this method is best suited for samples with relatively large features and minimal edge features at the magnification of interest.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims and all changes which come within the meaning and range of equivalency of the claims are, therefore, to be embraced therein.

What is claimed is:

1. A method of acquiring an image of a specimen comprising:
   (a) creating a charging map of said specimen including
      (i) first scanning said specimen for applying a first dose of a particle beam and storing corresponding detected first pixel intensities;
      (ii) second scanning said specimen applying a second dose of a particle beam greater than said first dose and storing corresponding detected second pixel intensities;
      (iii) subtracting said first and second pixel intensities to form values indicating charging areas and non-charging areas; and
   (b) selectively scanning said specimen based on said charging map after creating said charging map, to obtain an image of said specimen wherein charging areas are given a reduced dose of a particle beam relative to non-charging areas.

2. A method as recited in claim 1 wherein said first scanning is performed more rapidly than said second scanning for achieving said greater second dose.

3. A method as recited in claim 1 wherein a beam intensity of said second scanning is greater than a beam intensity of said first scanning for achieving said greater second dose.

4. A method as recited in claim 1 wherein said selectively scanning includes a first plurality of scans wherein each said charging area determined by said charging map is irradiated by a beam only during a calculated percentage of said first plurality of scans.

5. The method as recited in claim 1 wherein said non-charging areas are given a maximum dose of the particle beam.

6. The method as recited in claim 1 wherein said particle beam is an electron beam.

* * * * *

UNITED STATES PATENT AND TRADEMARK OFFICE
CERTIFICATE OF CORRECTION

PATENT NO.   : 6,608,305 B1
DATED         : August 19, 2003
INVENTOR(S)  : Wong Wai Kin, Jacob C. H. Phang and John Thong It is certified that error appears in the above-identified patent and that said Letters Patent is hereby corrected as shown below:

<u>Title page,</u>
Item [12], "Kin et al." should read -- Wong et al. --

Signed and Sealed this

Sixth Day of January, 2004

JAMES E. ROGAN
*Director of the United States Patent and Trademark Office*